(12) United States Patent
Yamada (10) Patent No.: US 7,834,526 B2
(45) Date of Patent: Nov. 16, 2010

(54) CONTOUR RESONATOR

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 305 days.

(21) Appl. No.: 12/099,538

(22) Filed: Apr. 8, 2008

(65) Prior Publication Data

US 2008/0252178 A1 Oct. 16, 2008

(30) Foreign Application Priority Data

Apr. 10, 2007 (JP) .............................. 2007-102416
Jan. 31, 2008 (JP) .............................. 2008-020330

(51) Int. Cl.
*H01L 41/00* (2006.01)
(52) U.S. Cl. .................. 310/367; 310/361; 310/366
(58) Field of Classification Search ................ 310/361, 310/366, 367
See application file for complete search history.

(56) References Cited

U.S. PATENT DOCUMENTS

| 2002/0163787 | A1* | 11/2002 | Kameda et al. | 361/752 |
|---|---|---|---|---|
| 2004/0263027 | A1* | 12/2004 | Kawashima | 310/361 |
| 2006/0290449 | A1* | 12/2006 | Piazza et al. | 333/187 |
| 2007/0063623 | A1* | 3/2007 | Nakao et al. | 310/366 |
| 2008/0179994 | A1* | 7/2008 | Sakaguchi et al. | 310/320 |

FOREIGN PATENT DOCUMENTS

| JP | B2 8-31758 | 3/1996 |
|---|---|---|
| JP | A 52-149084 | 12/1997 |
| JP | A 2001-313537 | 11/2001 |
| JP | A 2003-115747 | 4/2003 |
| JP | A 2005-26843 | 1/2005 |

OTHER PUBLICATIONS

Hirofumi Kawashima et al., "Lame-Mode Quartz Resonator Formed by Etching Process," $24^{th}$ EM, pp. 11 to 16, 1995 (with translation).
Katsuya Mizumoto et al., "Development of Small Sized Lame-Mode Quartz Crystal Resonators," $35^{th}$ EM Symposium, pp. 31-34, 2006 (with translation).
P. C. Y. Lee et al,, "Extensional Vibrations of Rectangular Crystal Plates," Proc. $35^{th}$ Ann. Freq. Control Symposium, pp. 222-229, May 1981.

* cited by examiner

*Primary Examiner*—Walter Benson
*Assistant Examiner*—Bryan P Gordon
(74) *Attorney, Agent, or Firm*—Oliff & Berridge, PLC (57) ABSTRACT

A contour resonator at least includes a first vibrating substrate and a second vibrating substrate having main surfaces that face each other and are bonded. The contour resonator includes a first excitation electrode provided on a front main surface of the first vibrating substrate, a second excitation electrode provided on a back main surface of the second vibrating substrate, and a common intermediate excitation electrode provided at an interface between the first vibrating substrate and the second vibrating substrate. The first excitation electrode and the second excitation electrode are electrically connected to constitute a first terminal. The intermediate excitation electrode constitutes a second terminal. The first vibrating substrate and the second vibrating substrate perform a contour vibration in accordance with an excitation signal applied between the first terminal and the second terminal.

5 Claims, 8 Drawing Sheets

YXltφ/θ SUBSTRATE

YXltφ/θ SUBSTRATE

YXltφ/θ±90° SUBSTRATE

YXIφ SUBSTRATE

YXlφ SUBSTRATE

YXltφ/±90° SUBSTRATE

FIG14B

CONTOUR RESONATOR

BACKGROUND OF THE INVENTION

1. Technical Field

The invention relates to a contour resonator in which a plurality of vibrating substrates are laminated and bonded.

2. Related Art

As piezoelectric resonators for portable apparatuses, information and communication apparatuses and measurement apparatuses, thickness shear resonators such as AT cut quartz crystal resonators and contour mode resonators such as DT cut quartz crystal resonators (contour shear quartz crystal resonators), Lame-mode quartz crystal resonators and pseudo-Lame-mode quartz crystal resonators. In "Lame-mode Quartz Crystal Resonator Formed by Etching Method", Hirofumi Kawashima and Masaru Matsuyama, 24th EM Symposium, pp. 11 to 16 (a first example of related art); and "Development of Small-sized Lame-mode Quartz Crystal Resonator", Masaya Mizumoto, Masashi Akino, Takashi Nishizuka, Hidenori Ashizawa, Masahide Marumo and Masato Amamiya, 35th EM Symposium, pp. 31 to 34 (a second example of related art), a Lame-mode quartz crystal resonator in which excitation electrodes are formed on the both surfaces of a rectangular quartz crystal substrate has been reported.

It has been shown that, between two facing sides of a quartz crystal substrate, excited are Lame-mode vibrations in which a distance between one two sides and a distance between the other two sides orthogonal thereto alternately expand and contract.

Disclosed in JP-A-2005-26843 is a Lame-mode quartz crystal resonator using a quartz crystal substrate for which $\theta$ is 40° to 50°, $\phi$ is −40° to −60° (that is, $\phi$ is 120° to 140°) or $\phi$ is 40° to 60° in the expression of cut angle represented as YXlt$\phi$/$\theta$ of IRE (abbreviation of Institute of Radio Engineers, now IEEE) standards.

Disclosed in JP-A-52-149084 is a GT-cut quartz crystal resonator in which $\theta$ is 40° to 50°. JP-A-2001-313537 and "Extensional Vibrations of Rectangular Crystal Plates", P. C. Y Lee, et al., Proc. 35th Ann. Freq. Control Symposium (1981) (a third example of related art) disclose that a ratio of sides of a GT-cut quartz crystal resonator of $\theta$=45° is set to 1, so that a Lame-mode quartz crystal resonator is achieved.

In JP-A-08-031758, a contour shear quartz crystal resonator is disclosed.

In such contour resonators, excitation electrodes are formed on both front and back sides of a single-layer quartz crystal substrate.

Here, reducing the distance between excitation electrodes on front and back sides (that is, reducing the thickness of a quartz crystal substrate) can increase the electric field efficiency to achieve a low-loss contour resonator.

However, there is a problem in that as the thickness of a quartz crystal substrate is reduced, the quartz crystal substrate is lacking in the structural strength including the support structure and therefore cannot endure the practical use.

SUMMARY

An advantage of the invention is to provide a contour resonator having high electric field efficiency and high structural strength can be achieved.

According to one aspect of the invention, a contour resonator at least including a first vibrating substrate and a second vibrating substrate having main surfaces that face each other and are bonded, includes a first excitation electrode provided on a front main surface of the first vibrating substrate, a second excitation electrode provided on a back main surface of the second vibrating substrate, and a common intermediate excitation electrode provided at an interface between the first vibrating substrate and the second vibrating substrate.

The first excitation electrode and the second excitation electrode are electrically connected to constitute a first terminal.

The intermediate excitation electrode constitutes a second terminal.

The first vibrating substrate and the second vibrating substrate perform a contour vibration in accordance with an excitation signal applied between the first terminal and the second terminal.

Preferably, the first vibrating substrate and the second vibrating substrate are identical to each other in resonance frequency, vibration mode and vibration displacement direction.

Assuming that a contour resonator of the invention has a laminated structure of the first and second vibrating substrates, for the first vibrating substrate, the first excitation electrode corresponds to an upper electrode, and the intermediate excitation electrode to a lower electrode.

On the other hand, for the second vibrating substrate, the intermediate excitation electrode corresponds to an upper electrode, the second excitation electrode to a lower electrode.

Accordingly, if the distance between excitation electrodes is reduced in each single body of the first vibrating substrate and the second vibrating substrate (that is, the thickness of each vibrating substrate is reduced), the first and second vibrating substrates are mutually laminated, so that the entire structure has a thickness twice that of the single body.

Thus, the electric field applied to the vibrating substrate can be increased by reducing the distance between excitation electrodes (that is, the electric field efficiency can be increased), and a contour resonator having sufficient structural strength for practical use can be achieved by bonding at the interface.

Note that if the first vibrating substrate and the second vibrating substrate are identical to each other in resonance frequency, vibration mode and vibration displacement direction, the first and second vibrating substrates do not inhibit their vibrations each other, enabling suppression of an increase in resonance resistance.

In the above contour resonator, a resonance frequency Fb of a single body of at least one vibrating substrate of the first vibrating substrate or the second vibrating substrate and a resonance frequency Fe of a single body of at least one excitation electrode of the first excitation electrode, the second excitation electrode or the intermediate excitation electrode may satisfy a relationship of $0.995 \times Fe \leq Fb \leq 1.005 \times Fe$.

Preferably, Fe=Fb.

With such a contour resonator, it can be suppressed that vibrations of vibrating substrates are inhibited by vibrations of excitation electrodes.

This allows good contour vibrations to be maintained.

Variations in frequency of a contour resonator caused by variations in film thickness of the excitation electrode can also be reduced.

Regarding the relationship between the resonance frequency Fb and the resonance frequency Fe, Fb=Fe is most preferable, but the foregoing effects are obtained if the difference between the resonance frequency Fb and the resonance frequency Fe is within ±0.5%.

In the above contour resonator, the contour resonator may be a Lame-mode resonator or a pseudo-Lame mode resonator, in which the first vibrating substrate and the second vibrating substrate are each made of a crystal having crystal anisotropy, and the first vibrating substrate and the second vibrating substrate are identical to each other in cut angle of the crystal and different from each other in in-plane rotation angle by 90°, or the first vibrating substrate and the second vibrating substrate are different from each other in a cut angle from the crystal by 180° and identical to each other or different from each other in in-plane rotation angle by 180°.

With such a contour resonator, the first vibrating substrate and the second vibrating substrate can be identical to each other in contour vibration mode and vibration displacement direction, and further vibrations in a contour vibration mode can be made vibrations in Lame-mode.

Accordingly, a Lame-mode resonator or a pseudo-Lame mode resonator having high electric field efficiency, low-loss, and high structural strength can be achieved.

In a Lame-mode resonator, four corners and the center of a vibrating substrate constitute nodes of the contour vibration (parts where displacement of contour vibration hardly occurs).

Therefore, support portions of the vibrating substrate can be provided in the nodes of the contour vibration.

This allows the inhibition of contour vibrations caused by the support to be remarkably reduced.

In a state where four corners of a vibrating substrate are not complete nodes, reduction is obtained as follows.

That is, when a vibration mode (hereinafter, referred to as a "pseudo-Lame mode") where, between two facing sides of a vibrating substrate, a distance between one two sides and a distance between the other two sides orthogonal thereto alternately expand and contract is provided, there are portions with relatively small contour vibration displacement in the vicinity of four corners of the vibrating substrate.

As a result, the inhibition of contour vibrations caused by the support can be reduced.

In the immediately above contour resonator, the first vibrating substrate and the second vibrating substrate may be each made of a rectangular quartz crystal substrate.

A cut angle of one quartz crystal substrate of the first vibrating substrate and the second vibrating substrate may be represented as YXlt$\phi$/$\theta$ of IRE standards.

A cut angle of an other quartz crystal substrate may be represented as YXlt$\phi$/$\theta$+90°, YXlt$\phi$/$\theta$−90°, YXlt$\phi$+180°/$\theta$, YXlt$\phi$+180°/$\theta$+180°, YXlt$\phi$+180°/$\theta$−180°, YXlt$\phi$−180°/$\theta$, YXlt$\phi$−180°/$\theta$+180° or YXlt$\phi$−180°/$\theta$−180.

In the immediately above contour resonator, $40°\leq\theta\leq50°$, $-50°\leq\theta\leq-40°$, $130°\leq\theta\leq140°$ or $140°\leq\theta\leq-130°$ may be satisfied.

With such a contour resonator, quartz crystal, which is stable piezoelectric single crystal, is used as crystals constituting vibrating substrates.

Therefore, a Lame-mode quartz crystal resonator or a pseudo-Lame-mode quartz crystal resonator having good temperature characteristics and small variation with time can be achieved.

In the above contour resonator, the contour resonator may be a Lame-mode resonator, in which the first excitation electrode is divided by n (n is an integer of 2 or more) in a planar direction, the intermediate excitation electrode and the second excitation electrode are divided by n to face the first excitation electrode, and one of n-divided excitation electrodes adjacent to each other is connected to the first terminal and the other is connected to the second terminal.

In this way, the first excitation electrode, the first vibrating substrate, the intermediate excitation electrode, the second vibrating substrate and the second excitation electrode are regarded as one set of a contour resonator, and n sets of contour resonators are formed.

A contour resonator having a high-order vibration mode in accordance with the number of sets can be achieved.

In the above contour resonator, the contour resonator may be a contour shear resonator, in which the first vibrating substrate and the second vibrating substrate are each made of a crystal having crystal anisotropy, and the first vibrating substrate and the second vibrating substrate are identical to each other in cut angle of the crystal and different from each other in in-plane rotation angle by 90°, or the first vibrating substrate and the second vibrating substrate are different from each other in cut angle from the crystal by 180° and identical to each other or different from each other in in-plane rotation angle by 90°.

With such a contour resonator, if contour shear vibrations are in a vibration mode common to the first vibrating substrate and the second vibrating substrate, the vibration displacement directions can be the same.

Thus, a contour shear resonator can be achieved that has high electric field efficiency, in which the first vibrating substrate and the second vibrating substrate do not mutually inhibit their vibrations, and that is low loss.

In the immediately above contour resonator, the first vibrating substrate and the second vibrating substrate may be each made of a rectangular quartz crystal substrate.

The cut angle of one quartz crystal substrate of the first vibrating substrate and the second vibrating substrate may be represented as YXlt$\phi$ of IRE standards.

The cut angle of the other quartz crystal substrate may be represented as YXlt$\phi$/$\theta$+90°, YXlt$\phi$/$\theta$−90°, YXlt$\phi$+180°/$\theta$+90°, YXlt$\phi$+180°/$\theta$−90°, YXlt$\phi$−180°/$\theta$+90° or YXlt$\phi$−180°/$\theta$−90°.

In the immediately above contour resonator, $-5°\leq\theta\leq5°$, $85°\leq\theta\leq95°$, $175°\leq\theta\leq185°$ or $-95°\leq\theta\leq-85°$ may be satisfied.

With such a contour resonator, quartz crystal, which is stable piezoelectric single crystal, is used as crystals constituting vibrating substrates.

Therefore, a contour shear quartz crystal resonator having good temperature characteristics and small variation with time can be achieved.

In the above contour resonator, an electrode material of the first excitation electrode, the second excitation electrode or the intermediate excitation electrode may be made of an electrode material mainly composed of any one of Al, Au, Ag and Cu.

The use of Al, Ag, Cu and Au, which are metal of low resistance, or an alloy mainly composed of any one of them can reduce the sheet resistance of an excitation electrode film, thus allowing achievement of the low-loss contour resonator.

BRIEF DESCRIPTION OF THE DRAWINGS

The invention will be described with reference to the accompanying drawings, wherein like numbers reference like elements.

FIGS. 3A to 3C are plan views showing the outer shape and the electrode configuration of contour resonators according to the first embodiment of the invention.

FIGS. 4A and 4B show a vibration portion of the vibrating substrate 20.

FIGS. 6A and 6B show the vibrating substrate 40 in a case of YXltϕ/θ90°.

FIGS. 9A and 9B show a contour resonator according to a second embodiment of the invention.

FIGS. 10A to 10C show vibrating substrate single bodies according to the second embodiment of the invention.

FIGS. 12A and 12B show a case of using a substrate such that the cut angle of a vibrating substrate 220 according to a third embodiment of the invention is represented as YXlϕ.

FIGS. 13A and 13B show a case of using a substrate such that the cut angle of a vibrating substrate 240 according to the third embodiment of the invention is represented as YXlϕ.

FIGS. 14A and 14B show a case where the cut angle of the vibrating substrate 240 according to the third embodiment of the invention is represented as YXltϕ/θ±90°.

DESCRIPTION OF EXEMPLARY EMBODIMENTS

In the following description, a cut angle ϕ and an in-plane rotation angle θ when cutting a vibrating substrate from a crystal having crystal anisotropy are represented as YXltϕ/θ or YXlϕ of IRE standards.

Initially, description on YXltϕ/θ and YXlϕ of IRE standards is given.

Figure 1:
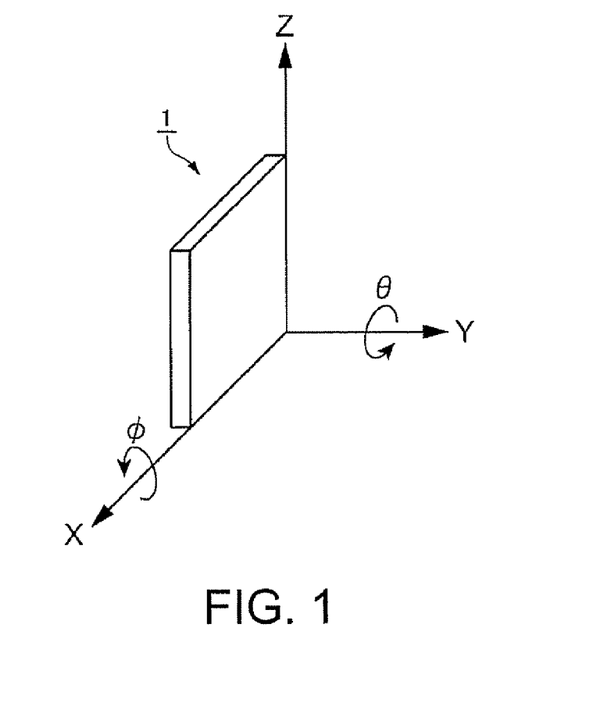
FIG. 1 is an explanatory view schematically showing a cut angle represented by YXlt$\phi$/$\theta$ of IRE standards.

FIG. 1 is a view for explaining a cut angle and an in-plane rotation angle represented as YXltϕ/θ of IRE standards.

FIG. 1, the crystal axes of crystals having crystal anisotropy, such as quartz crystal, piezoelectric single crystal or silicon single crystal such as $LiTaO_3$, $LiNbO_3$, $Li2B_4O_7$ or $La_3Ga_5SiO_{14}$, are represented as the X, Y and Z axes.

If the crystal is quartz crystal, the electrical axis is the X axis, the mechanical axis is the Y axis, and the optical axis is the Z axis.

The letter "Y" of YXltϕ/θ means that the thickness direction of a vibrating substrate 1 before rotation is taken in the Y axis.

The letter "X" of YXltϕ/θ means that the length direction of the vibrating substrate 1 before rotation (the direction along the long side if the planar shape of the vibrating substrate is rectangular) is taken in the Y axis.

The letter "l" of YXltϕ/θ means that a first rotation axis is in the length direction of the vibrating substrate 1, and the letter "ϕ" of YXltϕ/θ represents the rotation angle of the vibrating substrate 1 relative to the first rotation axis.

The letter "t" of YXltϕ/θ means that a second rotation axis is the thickness direction of the vibrating substrate 1 after the first rotation, and the letter "θ" of YXltϕ/θ represents the rotation angle of the vibrating substrate 1 relative to the second rotation axis.

First, rotation is performed by an angle ϕ using the X axis as the rotation axis, and coordinate systems of the crystal after rotation are X, y' and z' (omitted in the figure).

In the coordinate systems, rotation is further performed by an angle of θ using the Y' axis as the rotation axis.

The coordinate systems of the crystal after rotation are represented as x', y' and z".

If the second rotation is not performed and only the first rotation is performed, the rotation is to be written as YXltϕ/0° where θ=0° in compliance with the foregoing description.

However, the rotation may be written as YXlϕ in this case.

Note that, regarding the rotation direction of ϕ, the direction of rotating from +Z axis to −Y axis is meant as the plus rotation direction if the X axis is the first rotation axis.

Regarding the rotation direction of θ, the direction of rotating from +Z' axis to X axis is meant as the plus rotation direction if the y' axis is the second rotation axis.

Embodiments of the invention will be described below with reference to the drawings.

Figure 9A:
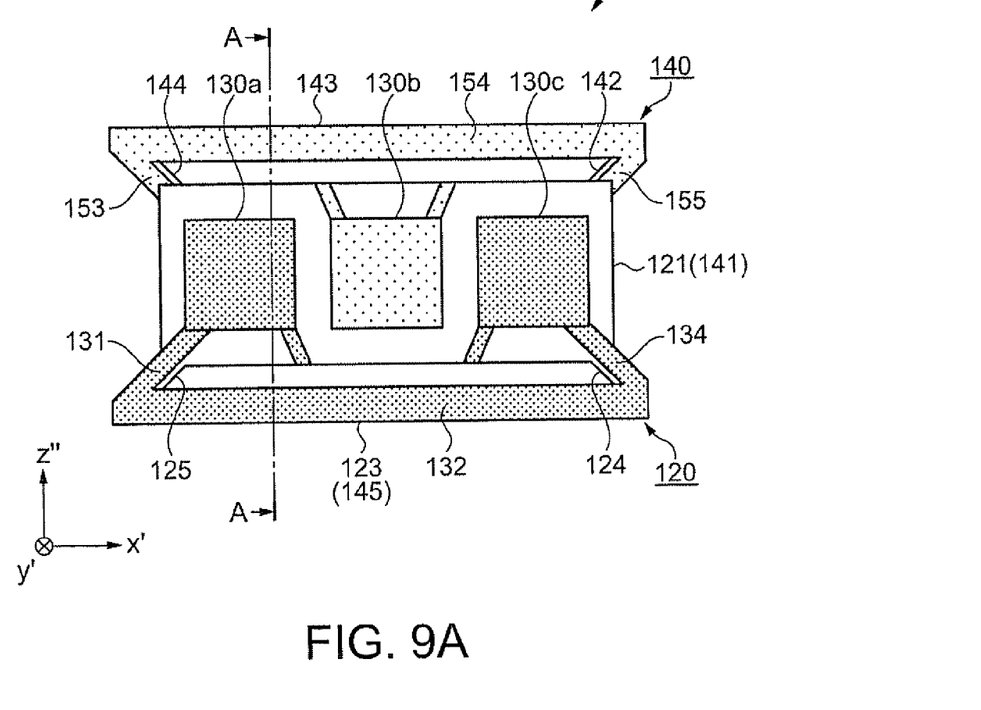
FIG. 9A is a plan view.
Figure 9B:
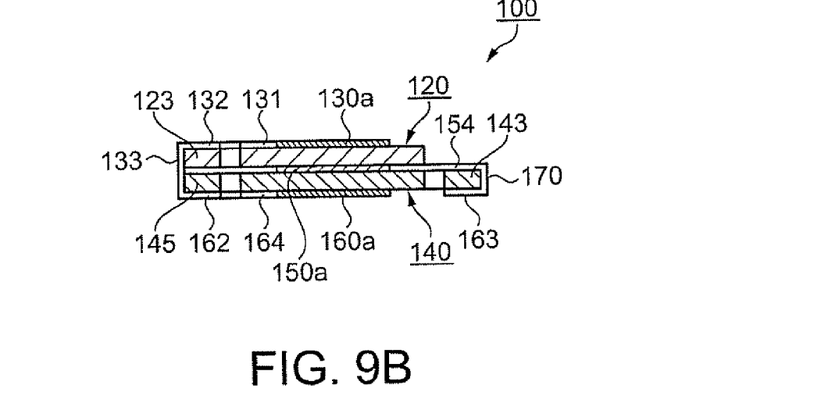
FIG. 9B is a sectional view taken along the line A-A of FIG. 9A.
Figure 10A:
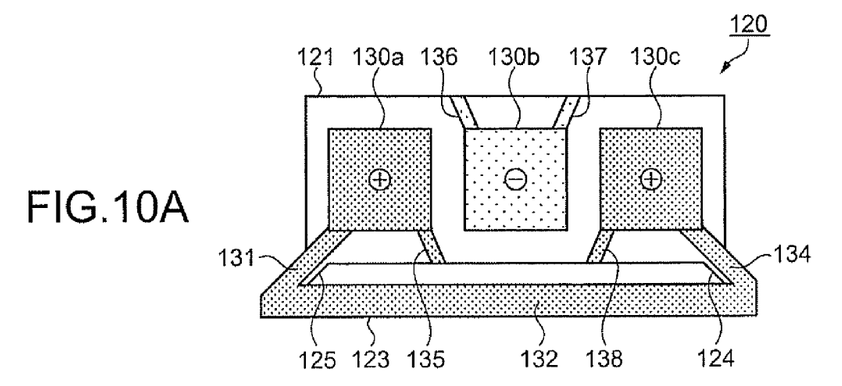
FIG. 10A is a top view of a vibrating substrate 120.
Figure 10B:
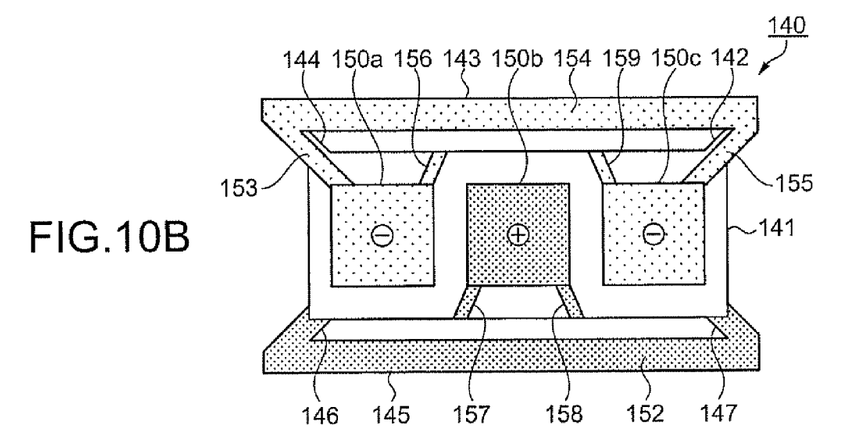
FIG. 10B is a top view of a vibrating substrate 140.
Figure 10C:
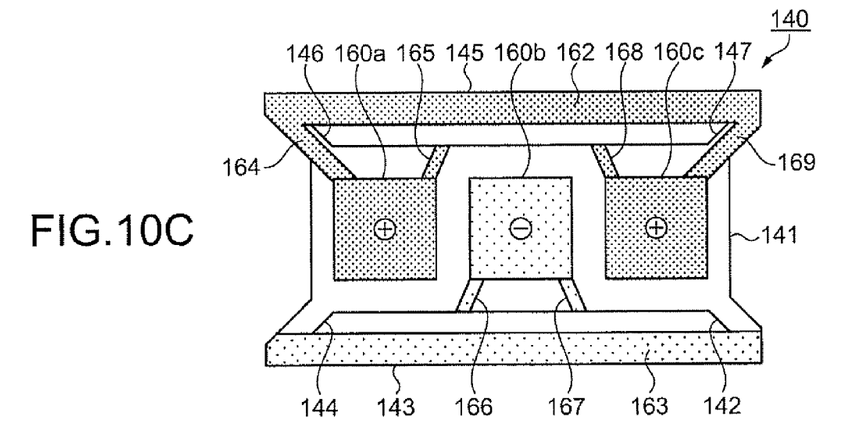
FIG. 10C is a bottom view of the vibrating substrate 140.
Figure 11:
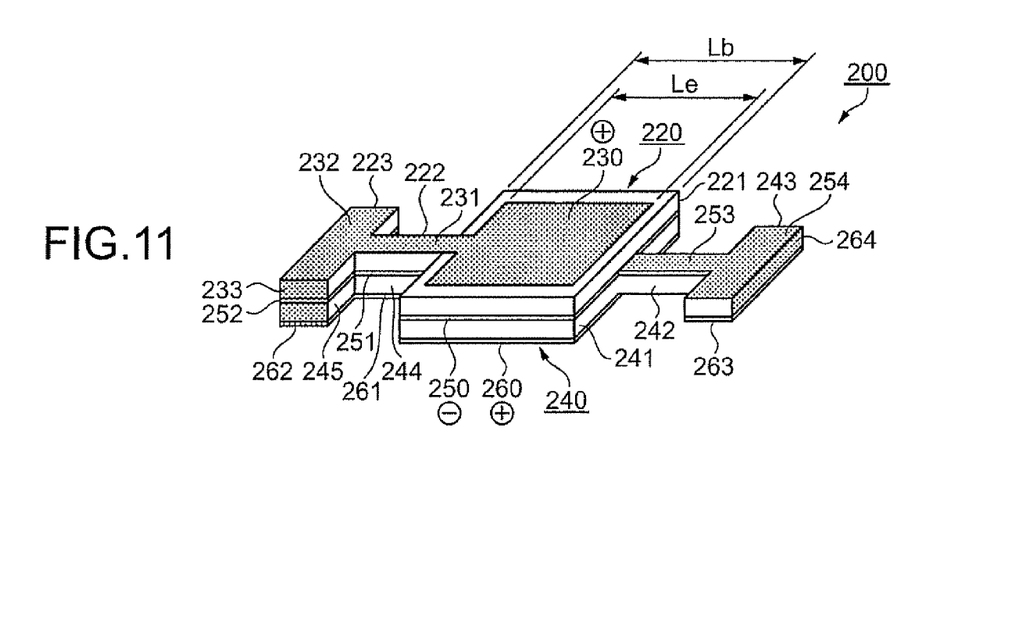
FIG. 11 is a perspective view showing a schematic structure of a contour shear resonator according to a third embodiment of the invention.
Figure 12A:
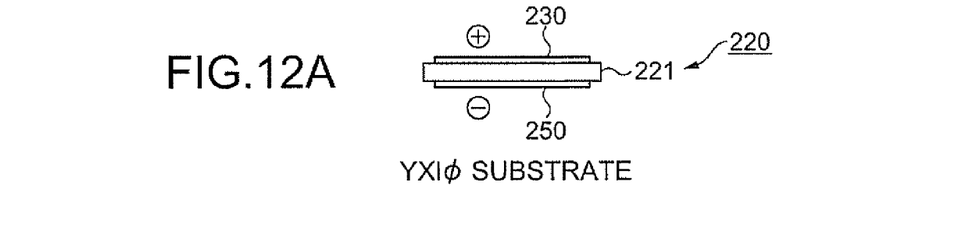
FIG. 12A is a side view.
Figure 12B:
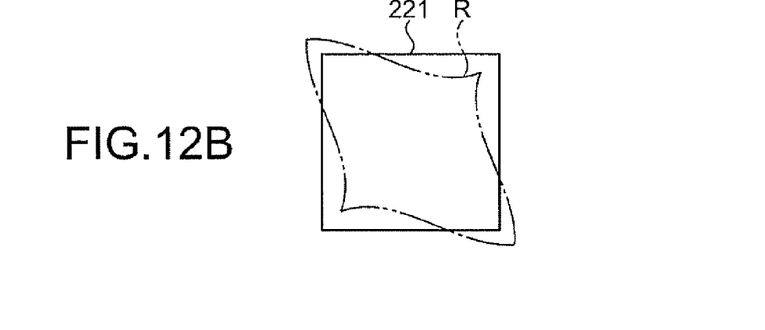
FIG. 12B is an explanatory view schematically showing the vibrating state.

FIGS. 2 to 8 show the structure and actions of contour resonators according to the first embodiment and modifications thereof, FIGS. 9A and 9B and 10A to 10C show those of contour resonators according to the second embodiment, and FIGS. 11, 12A and 12B show those of contour resonators according to the third embodiment.

Note that drawings referred to in the following description are schematic views where the scales in the length and the breadth of members and parts differ from actual ones for ease of illustration.

First Embodiment

Figure 2:
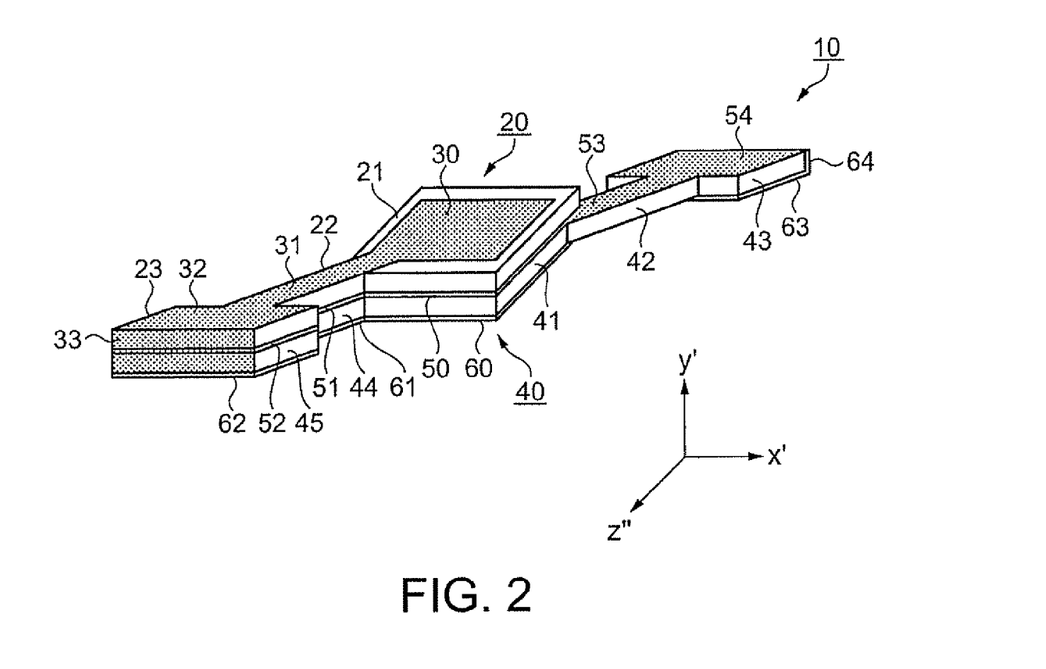
FIG. 2 is a perspective view showing the schematic structure of a contour resonator according to a first embodiment of the invention.

FIG. 2 is a perspective view showing the schematic structure of a contour resonator according to the first embodiment of the invention.

In FIG. 2, a contour resonator 10 is a laminated type contour resonator in which a vibrating substrate 20 (hereinafter, referred to as only a vibrating substrate 20) as a first vibrating substrate and a vibrating substrate 40 (hereinafter, referred to as only a vibrating substrate 40) as a second vibrating substrate have the main surfaces facing each other that are bonded.

Provided on the front main surface of the vibrating substrate 20 is an excitation electrode 30 (hereinafter, referred to as only an "excitation electrode 30") as a first excitation electrode, provided on the back main surface of the vibrating substrate 40 is an excitation electrode 60 (hereinafter, referred to as only an "excitation electrode 60") as a second excitation electrode, and provided at the interface between the vibrating substrate 20 and the vibrating substrate 40 is a common intermediate excitation electrode 50.

In the case of materials of vibrating substrates being fixed, the resonance frequency of a contour resonator is mainly dependent on the outer dimensions of the vibrating substrates (the details will be described later), and therefore the thicknesses of the vibrating substrates are not restricted by the resonance frequency although they are restricted in the thickness shear resonator.

In the contour resonator, the electric field efficiency for causing the vibrating substrate to vibrate in contour mode is increased by reducing the thickness of the vibrating substrate.

However, the vibrating substrate is likely to be broken if the thickness of the vibrating substrate is reduced.

With the structure shown in FIG. 2, the thickness of a laminate of the vibrating substrate 20 and the vibrating substrate 40 is increased even if the distance between excitation electrodes is reduced by reducing the thickness of the vibrating substrate.

This makes it difficult to cause vibration portions 21 and 41 to be broken.

The vibrating substrates 20 and 40 are preferably identical to each other in resonance frequency, vibration mode and vibration displacement direction so as not to mutually inhibit contour vibrations.

This enables suppression of an increase in resonance resistance.

The vibrating substrate 20 is a quartz crystal substrate represented as YXlt$\phi$/$\theta$ of IRE standards, and the vibrating substrate 40 is a quartz crystal substrate represented as YXlt$\phi$/$\theta$+90°, YXlt$\phi$/$\theta$−90°, YXlt$\phi$+180°/$\theta$, YXlt$\phi$+180°/$\theta$+180°, YXlt$\phi$+180°/$\theta$−180°, YXlt −180°/$\theta$, YXlt$\phi$−180°/$\theta$+180° or YXlt$\phi$−180°/$\theta$−180°.

Figure 3A:
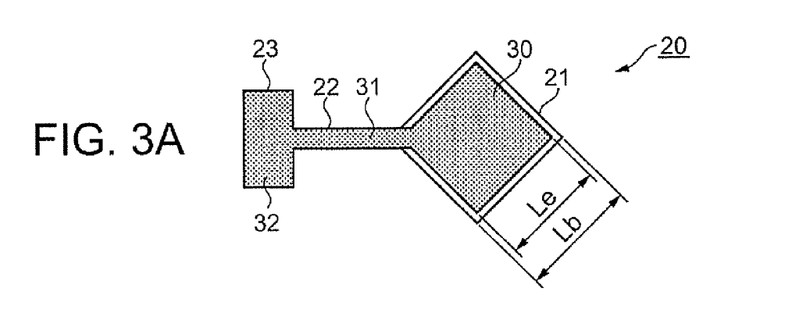
FIG. 3A is a top view of a vibrating substrate 20.
Figure 3B:
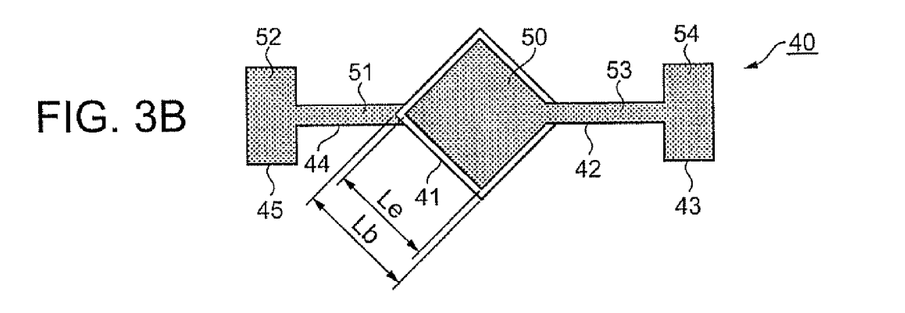
FIG. 3B is a top view of a vibrating substrate 40.
Figure 3C:
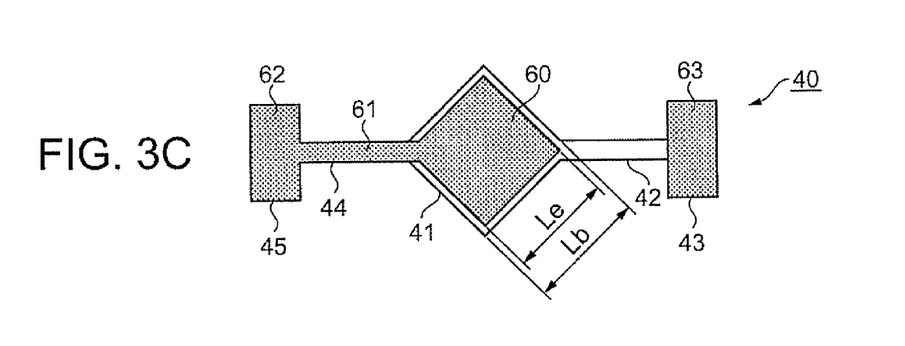
FIG. 3C is a bottom view of the vibrating substrate 40.

FIGS. 3A to 3C are plan views showing the outer shape and the electrode configuration of contour resonators vibrating substrate 20 and the vibrating substrate 40, shown disconnected.

FIG. 3A is a top view of the vibrating substrate 20, FIG. 3B is a top view of the vibrating substrate 40, and FIG. 3C is a bottom view of the vibrating substrate 40.

Referring to FIGS. 2 and 3A to 3C, the structure of the contour resonator 10 is described.

As shown in FIG. 3A, the vibrating substrate 20 includes the vibration portion 21, a support arm portion 22 extending from a corner of the vibration portion 21, and a support portion 23 provided in an end of the support arm portion 22.

An excitation electrode 30 is provided on the front main surface of the vibration portion 21, and is connected through a connection electrode 31 to a connection electrode 32 provided on the surface of the support portion 23.

Here, the vibration portion 21 and the excitation electrode 30 are each square, and the length of one side of the vibration portion 21 is represented as Lb and the length of one side of the excitation electrode 30 is represented as Le.

As shown in FIG. 3B, the vibrating substrate 40 includes the vibration portion 41, support arm portions 42 and 44 extending on both sides from the diagonal corners of the vibration portion 41, a support portion 43 provided at an end of the support arm portion 42, and a support portion 45 provided in an end of the support arm portion 44.

Provided on the front main surface (corresponding to the interface with the vibration portion 21) of the vibration portion 41 is an intermediate excitation electrode 50, which is connected through a connection electrode 53 on the surface of the support arm portion 42 to a connection electrode 54 on the surface of the support portion 43.

On the side of the support arm portion 44, on the other hand, the intermediate excitation electrode 50 is connected through a connection electrode 51 to a connection electrode 52 on the surface of the support portion 45.

The connection electrodes 51 and 52 are formed to be electrically separate from the intermediate excitation electrode 50, and are provided so as to enhance mutual contact of the vibrating substrate 20 and the vibrating substrate 40 when they are laminated and bonded.

In the vibrating substrate 40, the vibration portion 41 and the intermediate excitation electrode 50 are squares having the same dimensions as those of the vibrating substrate 20.

The length of one side of the vibration portion 41 can be represented as Lb, and the length of one side of the intermediate excitation electrode 50 can be represented as Le.

Also, as shown in FIG. 3C, provided on the back main surface of the vibrating substrate 40 is an excitation electrode 60, which is connected through a connection electrode 61 on the surface of the support arm portion 44 to the connection electrode 62 on the surface of the support portion 45.

On the side of the support portion 43, on the other hand, a connection electrode 63 is provided.

Note that the length of one side of the excitation electrode 60 can be represented as Le.

Note that an electrode material of each of the excitation electrode 30, the intermediate excitation electrode 50 and the excitation electrode 60 is selected from electrode materials mainly composed of Al, Au, Ag and Cu.

A state of the vibrating substrates 20 and 40 being laminated and bonded, which is shown in FIGS. 3A to 3C, is the contour resonator 10 shown in FIG. 2.

Here, the connection electrode 32 provided on the side of the front main surface of the vibrating substrate 20 is connected through a side electrode 33 to the connection electrode 62 provided on the back main surface of the vibrating substrate 40 to constitute a first terminal.

Accordingly, the excitation electrodes 30 and 60 come to electrodes having the same potential.

The connection electrode 54 provided on the top surface of the vibrating substrate 40 (specifically the support portion 43) is connected through a side electrode 64 to the connection electrode 63 on the side of the back main surface to constitute a second terminal (refer to FIG. 2).

Accordingly, the intermediate excitation electrode 50 has a potential different from those of the excitation electrode 30 and the excitation electrode 60.

If excitation signals are applied between the first terminal and the second terminal, the vibrating substrates 20 and 40 perform contour vibrations.

The contour resonator 10 structured in this way is a laminate including a contour resonator in which the excitation electrode 30 is an upper electrode and the intermediate excitation electrode 50 is a lower electrode for the vibration portion 21, and a contour resonator in which the intermediate excitation electrode 50 is an upper electrode and the excitation electrode 60 is a lower electrode for the vibration portion 41.

The connection electrodes 62 and 63 provided on the side of the back main surface of the vibrating substrate 40 shown in FIG. 3C are provided to be connected and fixed to a base of a package (not shown) such that excitation signals from the oscillation circuit are input through the connection electrodes 62 and 63 to the excitation electrode 30, the excitation electrode 60 and the intermediate excitation electrode 50.

Subsequently, the vibration mode of the contour resonator 10 of the embodiment is described with reference to the drawings.

Figure 4A:
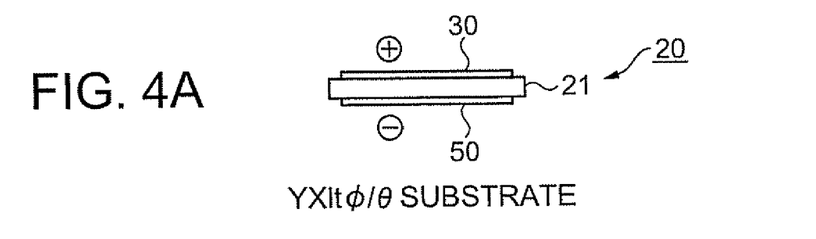
FIG. 4A is a side view and FIG. 4B is an explanatory view schematically showing the vibration mode.
Figure 4B:
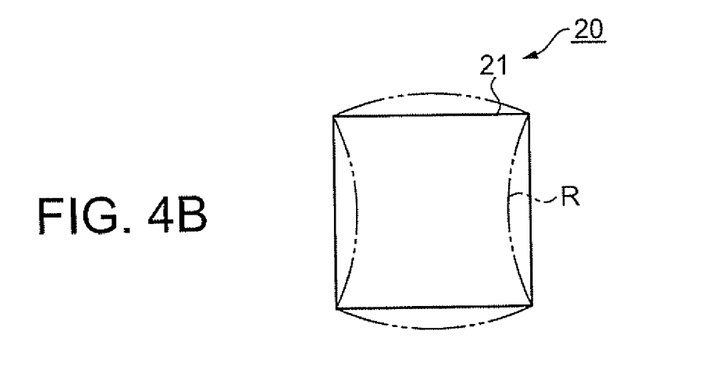

FIGS. 4A and 4B show the vibration portion 21 of the vibrating substrate 20.

FIG. 4A is a side view and FIG. 4B is an explanatory view schematically showing the vibration mode.

The vibrating substrate 20 is a rectangular plate in which the cut angle of the quartz crystal substrate is represented as YXltφ/θ of IRE standards.

When a positive potential is applied to the excitation electrode 30 (corresponding to the upper electrode) and a negative potential is applied to the intermediate excitation electrode 50 (corresponding to the lower electrode), the vibrating substrate 20 vibrates in Lame-mode as shown by a two dot chain line R in FIG. 4B.

The cut angle and the vibration mode of the vibrating substrate 40 at this point is described with reference to FIGS. 5A to 6B.

Figure 5A:
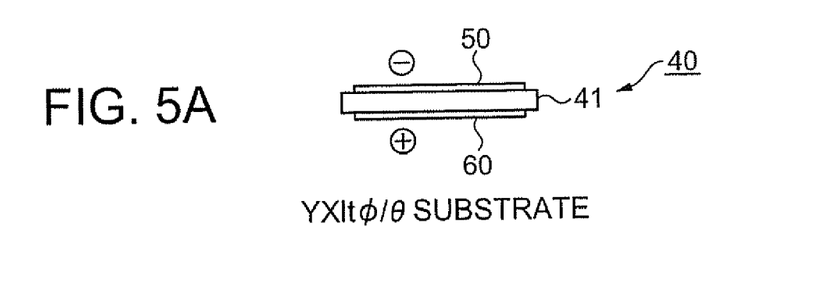
FIG. 5A is a side view and FIG. 5B is an explanatory view schematically showing the vibration mode of the vibrating substrate 40 when it has the same cut angle as that of the vibrating substrate 20.
Figure 5B:
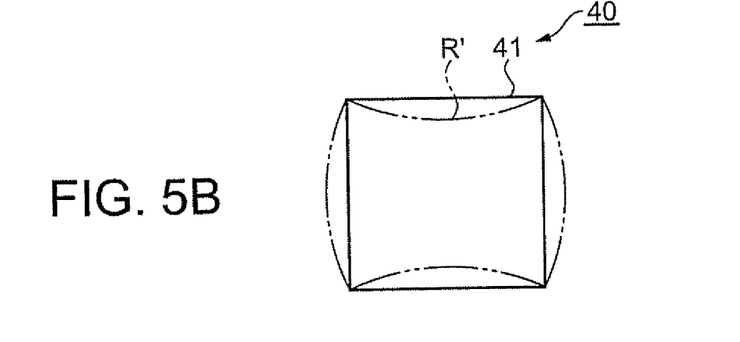

FIGS. 5A and 5B show a case where a quartz crystal substrate of YXltφ/θ, which is the same as used for the vibrating substrate 20, is used for the vibrating substrate 40.

FIG. 5A is a side view and FIG. 5B is an explanatory view schematically showing the vibration mode.

Here, the intermediate excitation electrode 50 is an electrode common with the vibrating substrate 20, and therefore has a negative potential, whereas the excitation electrode 60 has the same potential as that of the excitation electrode 30, and therefore has a positive potential.

Accordingly, if the vibrating substrate 20 and the vibrating substrate 40 have the completely same cut angle and an opposite phase excitation signal is applied, the vibrating substrate 40 has a vibration mode with a phase shift of 90° with respect to the vibration mode of the vibrating substrate 20 as shown in FIG. 5B.

Concurrently driving the vibrating substrate 40 and the vibrating substrate 20 inhibit their vibrations each other.

Figure 6A:
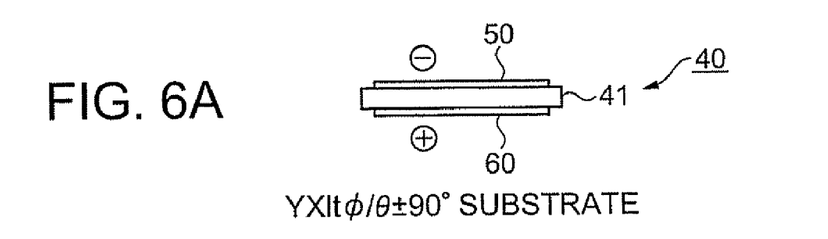
FIG. 6A is a side view.
Figure 6B:
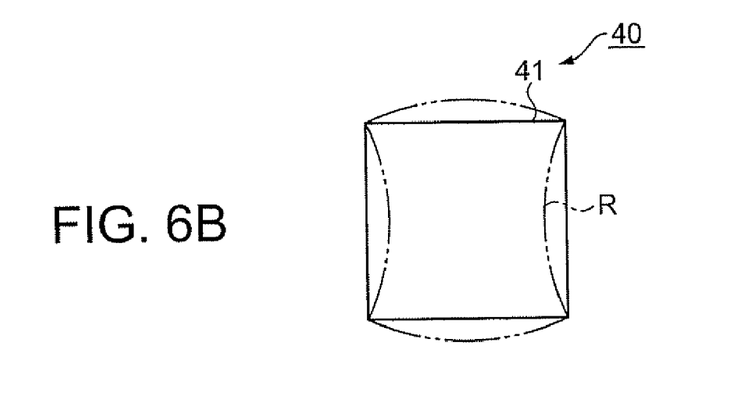
FIG. 6B is an explanatory view schematically showing the vibration state.

To address this problem, the cut angle of a quartz crystal substrate in the vibrating substrate 40 is set to YXltφ/θ±90° of IRE standards as shown in FIGS. 6A and 6B to cause the vibration mode of the vibrating substrate 40 to agree with that of the vibrating substrate 20.

FIGS. 6A and 6B represent a case of using a quartz crystal substrate of YXltφ/θ+90° or YXltφ/θ−90° as the vibrating substrate 40.

FIG. 6A is a side view, and FIG. 6B is an explanatory view schematically showing the vibration mode.

In this way, an opposite potential to that of the vibrating substrate 20, that is, an excitation signal of opposite phase to that of the vibration substrate 20 is applied to the vibrating substrate 40, the vibrating substrate 40 has the same vibration mode as that of the vibrating substrate 20. Mutual vibrations are not inhibited.

The vibrating substrate 40 of YXltφ+180°/θ, YXltφ+180°/θ+180°, YXltφ+180°/θ−180°, YXltφ−180°/θ, YXltφ−180°/θ+180° or YXltφ−180°/θ+180° may be combined with the vibrating substrate 20 of YXltφ/θ.

The cut angle of YXltφ+180°/θ or YXltφ−180°/θ means that the two sides of the crystal of the vibrating substrate are reversed, that is, the vibration mode is left-right reversed.

Therefore, if an excitation signal having a phase opposite to that of the vibrating substrate 20 is applied to the vibrating substrate 40, the vibrating substrate 40 has the same vibration mode as that of the vibrating substrate 20, which is not shown in the figure.

In the case of 4 is constant, the vibration mode and the vibration displacement direction are the same among θ, θ+180° and θ−180°.

For example, in the case of the vibrating substrate 20 having a LQ2T cut of φ=−50° and θ=+45°, if the cut angle of the vibrating substrate 40 is set to φ=−50° and θ=−45° (corresponding to YXltφ/θ−90°) or φ=130° and θ=+45° (corresponding to YXltφ+180°/θ), the vibration modes of the vibrating substrate 20 and the vibrating substrate 40 agree with each other.

In addition, the cut angle of the vibrating substrate 40 described above may be YXltφ/θ, and the cut angle of the vibrating substrate 20 may be YXltφ/θ±90° or YXltφ±180°/θ.

Subsequently, a relationship between the planar dimensions of the vibration portion and the planar dimensions of the excitation electrode is described.

Description is given taking a relationship between the vibration portion 21 and the excitation electrode 30 as a representative.

FIGS. 3A to 3C are referred to.

The frequency equation to determine the resonance frequency f of the Lame-mode resonator is given by the aforementioned first example of related art (p. 12, mathematical expression (9)).

小野澤コメント mathematical expression 1
に記載頂きますようお願い致します。
を忘れず

$$f = \frac{m}{2(2x_o)}\sqrt{\frac{c'_{11} - c'_{13}}{\rho}} = \frac{n}{2(2z_o)}\sqrt{\frac{c'_{11} - c'_{13}}{\rho}} \quad (1)$$

where ρ is the mass density of a vibration portion, C'11 and C'13 are elastic constants (constants obtained by modifying an elastic stiffness constant Cpq in accordance with the first example of related art (p. 11. the proviso of equation (2)), and m=n=1.

2x0 is the vertical side length of the vibration portions 21 and 41, and 2z0 is the horizontal side length, and 2x0=2z0=Lb in FIGS. 3A to 3C.

Note that if the material constant of the excitation electrode is used for ρ, C'11 and C'13 and 2x0=2z0=Le, the resonance frequency of a single body of the excitation electrode can be determined by the same frequency equation.

Further, it is shown that mathematical expression 1 holds even if the vibration portion and the excitation electrode are rectangular (e.g., the horizontal length is integer times the vertical length).

As such, regarding Lame-mode resonators, the resonance frequency is determined by the planar dimensions.

When the resonance frequency for the length Lb of one side in a single body of the vibration portion 21 is Fb and the resonance frequency for the length Le of one side in a single body of the excitation electrode 30 is Fe, Lb and Le are designed so as to achieve Fb≅Fe.

This design causes the both vibration portion 21 and the excitation electrode 30 to have vibration modes of Lame-mode having the same frequency. Here, Fb≅Fe specifically means 0.995×Fe≦Fb≦1.005×Fe.

Thus, contour vibrations of the vibration portion 21 are not inhibited by contour vibrations of the excitation electrode 30, allowing good contour vibrations to be maintained.

Both the vibration portion 21 and the excitation electrode 30 perform Lame-mode vibrations of the same frequency, allowing reduction of variations in frequency of a contour resonator caused by variations in film thickness of the excitation electrode 30.

Regarding the relationship between the resonance frequency Fb and the resonance frequency Fe, Fb=Fe is most preferable, but the foregoing effects are obtained if the difference between the resonance frequency Fb and the resonance frequency Fe is within ±0.5%.

If the contour vibration frequency constant on the side of the vibrating substrate is $\zeta b$ and the contour vibration frequency constant on the side of the excitation electrode is $\zeta e$, the constants can be expressed as $\zeta b = Fb \cdot Lb$ and $\zeta e = Fe \cdot Le$.

Accordingly, it is preferable that Le and Lb be set to satisfy $Le = (\zeta e/\zeta b) Lb$.

It is more preferable that this relationship hold true between the vibrating substrate 20 and each of the excitation electrode 30 and the intermediate excitation electrode 50 and between the vibrating substrate 40 and each of the intermediate excitation electrode 50 and the excitation electrode 60.

The intermediate excitation electrode 50 at the interface between the vibrating substrate 20 and the vibrating substrate 40 is particularly important.

According to the first embodiment described above, the contour resonator 10 of the present embodiment has a two-layer structure of the vibrating substrate 20 and the vibrating substrate 40 although vibrating substrates of related art have a structure of a single body.

While the electric field efficiency is increased by reducing the distance between electrodes in each single body of the vibrating substrate 20 and the vibrating substrate 40, a contour resonator having structural strength sufficient for practical use can be achieved by employing the laminated structure.

The vibrating substrate 20 and the vibrating substrate 40 are made of quartz crystal substrates.

One of the vibrating substrate 20 and the vibrating substrate 40 is a rectangular plate in which the cut angle of the quartz crystal substrate is represented as YXlt$\phi/\theta$ of IRE standards.

The other of them is a rectangular plate represented as YXlt$\phi/\theta+90°$, YXlt$\phi/\theta-90°$, YXlt$\phi+180°/\theta$, YXlt$\phi+180°/\theta+180°$, YXlt$\phi+180°/\theta-180°$, YXlt$\phi-180°/\theta$, YXlt$\phi-180°/\theta+180°$ or YXlt$\phi-180°/\theta-180°$.

When excitation signals of the same potential are applied to the excitation electrode 30 and the excitation electrode 60 and excitation signals of opposing potential are applied to the intermediate excitation electrode 50, the vibrating substrate 20 and the vibrating substrate 40 vibrate in Lame-mode with their vibration modes and vibration displacement directions in agreement with each other.

Therefore, a Lame-mode resonator having high electric field efficiency and high structural strength can be achieved.

In particular, if a condition of $40° \leq \theta \leq 50°$, $-50° \leq \theta \leq -40°$, $130° \leq \theta \leq 140°$ or $-140° \leq \theta \leq -130°$ is satisfied, a Lame-mode resonator having good vibration characteristics can be achieved.

In a Lame-mode resonator, four corners and the center of a vibrating substrate constitute nodes of the contour vibration (parts where displacement of contour vibration hardly occurs).

Therefore, support portions of the vibrating substrate can be provided in the nodes of the contour vibration.

This allows inhibition of contour vibrations caused by supports to be remarkably reduced.

In a pseudo-Lame mode resonator where four corners of a vibrating substrate are not complete nodes, when the mode is such that, between two facing sides of a vibrating substrate, a distance between one two sides and a distance between the other two sides orthogonal thereto alternately expand and contract, there are portions with relatively small contour vibration displacement in the vicinity of four corners of the vibrating substrate.

This allows the inhibition of contour vibrations caused by the support to be reduced.

In the foregoing first embodiment, quartz crystal, which is stable piezoelectric single crystal, is used as crystals constituting vibrating substrates.

Thus, a contour resonator having good temperature characteristics and small variation with time can be achieved.

However, if piezoelectric single crystal or silicon single crystal such as $LiTaO_3$, $LiNbO_3$, $Li_2B_4O_7$ or $La_3Ga_5SiO_{14}$ is used, the invention may also be applied.

In this case, it is only necessary to be a Lame-mode resonator or a pseudo-Lame mode resonator in which the vibrating substrate 20 and the vibrating substrate 40 are made of crystals having crystal anisotropy, and they are identical to each other in cut angle of the crystal and different from each other in in-plane rotation angle by 90° or they are different from each other in cut angle of the crystal by 180° and identical to each other or different from each other by 180° in in-plane rotation angle.

Vibrating substrates having different cut angles are combined with each other to make a laminate.

This causes their frequency temperature characteristics to be complementary to each other.

As a result, there is an effect that a contour resonator having excellent temperature characteristics can be provided.

The dimension of one side of each of the vibrating substrates 20 and 40 and excitation electrodes is set such that the resonance frequency Fb of a single body of the vibrating substrate 20 and the vibrating substrate 40 in the same contour vibration mode and the resonance frequency Fe of a single body of the excitation electrode satisfy Fb≅Fe.

This setting eliminates the inhibition of vibrations of vibrating substrates caused by the addition of excitation electrodes, thus enabling a good contour vibration mode to be maintained.

Metallic materials mainly composed of Ag, Cu, Au and Al are employed as electrode materials of the excitation electrode 30, the intermediate excitation electrode 50 and the excitation electrode 60.

All these materials are low resistance metal, and therefore can reduce the sheet resistance of an excitation electrode film, thus allowing achievement of the low-loss contour resonator 10.

The use of Al is particularly preferable for each excitation electrode.

Enlarging the area of the excitation electrode facilitates achievement of a low-loss contour resonator.

In order to satisfy Fb≅Fe in addition to maximizing the area of the excitation electrode, the mass density and the elastic constant of an excitation electrode need to be as close as possible to those of the vibrating substrate.

With the use of quartz crystal as each vibrating substrate and the use of Al as each excitation electrode, it is possible to increase the area of each excitation electrode while satisfying the relationship of Fb≅Fe.

Therefore, a low-loss contour resonator can be achieved while the frequency sensitivity to the film thickness is kept low.

First Modification

Next, a first modification of the first embodiment will be described with reference to the drawings.

The first modification has a feature in the structure of an intermediate excitation electrode.

Figure 7:
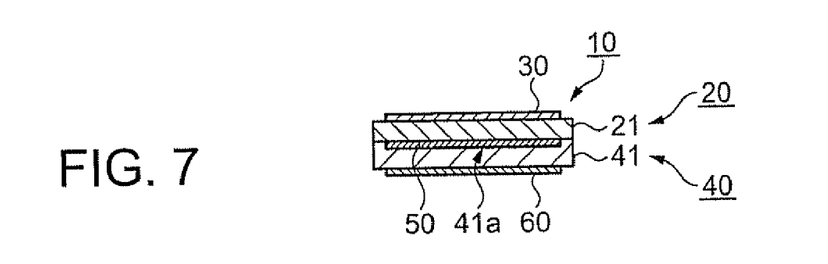
FIG. 7 is a partial sectional view according to a first modification of an embodiment of the invention.

FIG. 7 is a partial sectional view according to the first modification.

In FIG. 7, the first excitation electrode 30 is provided on the front main surface of the vibration portion 21 at the center of the vibrating substrate 20, the excitation electrode 60 is on the back main surface of the vibration portion 41 at the center of the vibrating substrate 40, and the intermediate excitation electrode 50 is at the interface of the vibration portion 21 and the vibration portion 41.

Here, as shown in the drawing, a recess 41a having a shape corresponding to the intermediate excitation electrode 50 is provided by making a hole in the vibration portion 41, and the intermediate excitation electrode 50 is formed in the recess 41a.

After the intermediate excitation electrode 50 is formed, if a process of concurrently polishing the vibrating substrate 40 and the intermediate excitation electrode 50 is provided, the vibration portion 41 and the intermediate excitation electrode 50 can be finished to be coplanar with each other, thus making the interface between the vibrating substrate 20 and the vibrating substrate 40 close.

Second Modification

Subsequently, a contour resonator according to a second modification of the first embodiment will be described with reference to the drawings.

The second modification has a feature of a multiple-substrate structure where three or more vibrating substrates are used.

Figure 8:
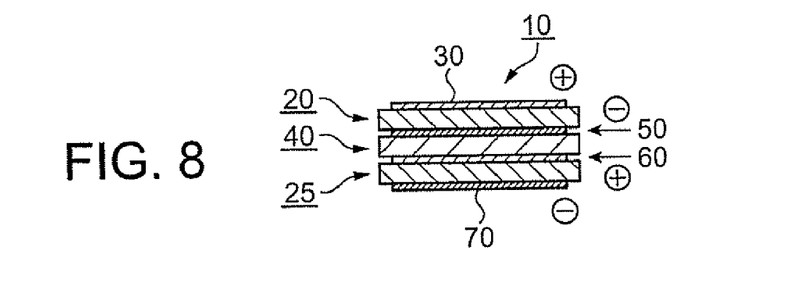
FIG. 8 is a partial sectional view according to a second modification of the first embodiment of the invention.

FIG. 8 is a partial sectional view according to the second modification.

In FIG. 8, the contour resonator 10 has a structure where the vibrating substrate 20 and the vibrating substrate 40, and further a vibrating substrate 25 are laminated, in the order from the top of the drawing.

The vibrating substrate 20 is a quartz crystal substrate whose cut angle is represented as YXlt$\phi$/$\theta$, the vibrating substrate 40 is a quartz crystal substrate whose cut angle is represented as YXlt$\phi$±180°/$\theta$ or YXlt$\theta$/$\theta$±90°.

The vibrating substrate 25, the bottom layer, is a quartz crystal substrate whose cut angle is represented as YXlt$\phi$/$\theta$ (that is, the same cut angle as that of the vibrating substrate 20).

A positive potential is applied to the excitation electrode 30 provided on the vibrating substrate 20, a negative potential to the intermediate excitation electrode 50 at the interface between the vibrating substrate 20 and the vibrating substrate 40, a positive potential to an intermediate excitation electrode (corresponding to the excitation electrode 60) at an interface of the vibrating substrate 40 and the vibrating substrate 25, and a negative potential to a third excitation electrode 70 provided on the back main surface of the vibrating substrate 25.

The vibrating substrates 20 and 25 agree with each other in cut angle and applied potential, and therefore Lame-mode vibrations common to them are excited.

With the cut angle of YXlt$\phi$±180°/$\theta$ or YXlt$\phi$/$\theta$90°, the vibrating substrate 40 vibrates in Lame-mode in agreement with the vibrating substrates 20 and 25, just as in the foregoing first embodiment (refer to FIGS. 4A to 6B).

216 In this way, the thickness of a single body of the vibrating substrate is made less than that of the vibrating substrate in a two-piece structure to increase the electric field efficiency.

Also, the structural strength can be enhanced to a level of practical use by laminating the vibrating substrates.

Note that the vibrating substrate may be in a multiple-layer substrate where three or more vibrating substrates are laminated.

In this case, the vibrating substrate having a cut angle of YXlt$\phi$/$\theta$ and the vibrating substrate having a cut angle of YXlt$\phi$±180°/$\theta$ or YXlt$\phi$/$\theta$±90° should be alternately laminated.

Second Embodiment

Next, a contour resonator according to the second embodiment of the invention will be described with reference to the drawings.

FIGS. 9A and 9B show a contour resonator according to the second embodiment.

FIG. 9A is a plan view, and FIG. 9B is a sectional view taken along the line A-A of FIG. 9A.

FIGS. 10A to 10C are plan views showing single bodies of the vibrating substrate.

FIG. 10A is a top view of the vibrating substrate 120, FIG. 10B is a top view of the vibrating substrate 140, and FIG. 10C is a bottom view of the vibrating substrate 140.

In FIGS. 9A and 9B and FIGS. 10A to 10C, a contour resonator 100 is composed of the vibrating substrate 120 and the vibrating substrate 140 laminated on each other.

As shown in FIG. 10A, the vibrating substrate 120 includes support arm portions 124 and 125 extending from a support portion 123, and a rectangular vibration portion 121, which is long in the x' direction, supported by two portions, support arm portions 124 and 125.

Formed on the front main surface of the vibration portion 121 are excitation electrodes 130a, 130b and 130c.

Here, the excitation electrodes 130a and 130c are ones to which the same potential (e.g., positive potential) is applied, and the excitation electrode 130b is one to which a different potential (e.g., negative potential) is applied.

The vibrating substrate 120 is a quartz crystal substrate whose cut angle is represented as YXlt$\phi$/$\theta$.

The excitation electrode 130a is connected from an end of one side through the connection electrode 131 to the connection electrode 132 in the support portion 123.

The connection electrode 135 is connected through a side electrode (not shown) to the connection electrode 157 (refer to FIG. 10B) extending from an excitation electrode 150b of the vibrating substrate 140.

Likewise, the excitation electrode 130c is connected through one connection electrode 134 to the connection electrode 132, and the other connection electrode 138 is connected through a side electrode (not shown) to a connection electrode 158 (refer to FIG. 10B) extending from the excitation electrode 150b of the vibrating substrate 140.

In the excitation electrode 130b, the connection electrodes 136 and 137 are connected through a side electrode, not shown in the figure, to connection electrodes 156 and 159 of the vibrating substrate 140, respectively, to be connected to a connection electrode 154 (refer to FIG. 10B) on the top surface of a support portion 143.

As shown in FIG. 10B, the vibrating substrate 140 has a vibration portion 141 supported in the corners by four portions, support arm portions 142, 144, 146 and 147 extending from support portions 143 and 145.

The vibrating substrate 140 has the same shape of the vibration portion 141 as that of the vibration portion 121 in the vibrating substrate 120, and is made of a quartz crystal substrate whose cut angle is YXlt$\phi$±180°/$\theta$ or YXlt$\phi$/$\theta$±90°.

On a surface of the vibration portion 141 (an interface with the vibration portion 121), excitation electrodes 150a, 150b and 150c are provided facing excitation electrodes 130a, 130b and 130c.

For the vibrating substrate 120, the excitation electrodes 130a, 130b and 130c are upper electrodes, and the excitation electrodes 150a, 150b and 150c are lower electrodes.

For the vibrating substrate 140, the excitation electrodes 150a, 150b and 150c are upper electrodes.

That is, the excitation electrodes 150a, 150b and 150c correspond to intermediate excitation electrodes for the vibrating substrate 120 and the vibrating substrate 140.

A potential (e.g., a negative potential) opposite to that of the excitation electrodes 130a and 130c is applied to the excitation electrodes 150a and 150c, and a potential (e.g., positive potential) opposite to that of the excitation electrode 130b is applied to the excitation electrode 150b.

The vibrating substrate 120 is a quartz crystal substrate whose cut angle is represented as YXltϕ/θ, and therefore vibrates in the vibration mode mentioned in the foregoing first embodiment.

A vibration portion sandwiched by the excitation electrodes 130a and 150a and a vibration portion sandwiched by the excitation electrodes 130c and 150c vibrate in a vibration mode as shown in FIG. 4B, and a vibration portion sandwiched by the excitation electrodes 130b and 150b vibrates in a vibration mode as shown in FIG. 5B.

Therefore, vibration portions adjacent to one another each perform in-plane vibrations with the phase shifted by 90°, resulting in vibrations in good balance as a whole.

Thus, vibrations in multi-order mode is achieved.

Note that the excitation electrode 150a is connected through a connection electrode 153 to the connection electrode 154 provided in the support portion 143, and the excitation electrode 150c is connected through a connection electrode 155 to the connection electrode 154.

An electrode 152 is provided to make the vibrating substrate 120 in close contact with the vibrating substrate 140.

The excitation electrode 150b is connected through the connection electrodes 157 and 158 and a side electrode, not shown in the figure, to connection electrodes 165 and 168 of the back main surface of the vibrating substrate 140 and the a connection electrode 162 of the support portion 145 (refer to FIG. 10C).

As shown in FIG. 10C, provided on the back main surface of the vibrating substrate 140 are excitation electrodes 160a, 160b and 160c facing the excitation electrodes 150a, 150b and 150c, respectively.

The excitation electrodes 160a and 160c are electrodes having a potential (e.g., positive potential) opposite to that of the excitation electrodes 150a and 150c, and the excitation electrode 160b is one to which a potential (e.g., negative potential) opposite to the excitation electrode 150b is applied.

The vibrating substrate 140 is a quartz crystal substrate whose cut angle is represented as YXltϕ±180°/θ or YXltϕ/θ±90°, and therefore performs Lame-mode vibrations having the same vibration mode as that of the aforementioned vibrating substrate 120.

When the vibrating substrates 120 and 140 are laminated and bonded, the connection electrode 132 is connected through a side electrode 133 to a connection electrode 162 on the back main surface of the support portion 145 (refer to FIG. 9B).

At this point, the excitation electrodes 130a, 130c, 150b, 160a and 160c are each connected to the connection electrode 162.

The connection electrode 154 is connected through a side electrode 170 to a connection electrode 163 on the back main surface of the support portion 143 (refer to FIG. 9B).

At this point, the excitation electrodes 130b, 150a, 150c and 160b are each connected to the connection electrode 163.

Therefore, by inputting excitation signals to the connection electrodes 163 and 162 on the back main surface sides of the support portions 143 and 145 of the vibrating substrate 140, vibrations in multi-order mode can achieved.

Note that an example in which the excitation electrode is divided by three in the x' direction and three sets of vibration portions each having an excitation electrode are formed is mentioned in the second embodiment.

However, a Lame-mode resonator in which the excitation electrode is divided by n (n is an integer of two or more) and excitation electrodes facing in the planar direction and the thickness direction are disposed so as to have potentials opposite to each other may be provided.

The contour resonator 100 structured in this way has a higher vibration mode compared with the contour resonator 10 of the first embodiment, and is referred to as 1×n-order mode resonator because of its array, where 1 represents the number of vibration modes in the z" direction, and n (n is an integer) is the number of vibration modes in the x' direction.

That is, the Lame-mode resonator described in the second embodiment is referred to as a "1×third order Lame-mode resonator".

Thus, it is also possible to form m divided vibration portions in the z" direction to provide a m×n-order mode Lame-mode resonator.

Third Embodiment

Subsequently, a contour resonator according to the third embodiment of the invention will be described with reference to the drawings.

The contour resonator of the third embodiment is a contour shear resonator having a contour shear mode as the vibration mode.

FIG. 11 is a perspective view showing a schematic structure of a contour shear resonator according to the third embodiment.

In FIG. 11, a contour shear resonator 200 is a laminated type contour resonator in which a vibrating substrate as a first vibrating substrate (hereinafter, referred to as only a vibrating substrate 220) 220 and a vibrating substrate as a second vibrating substrate (hereinafter, referred to as only a vibrating substrate 240) 240 both having common resonance frequency and vibration mode have the main surfaces facing each other that are bonded.

Provided on the front main surface of the vibrating substrate 220 is an excitation electrode as a first excitation electrode (hereinafter, referred to as only an "excitation electrode 230") 230, provided on the back main surface of the vibrating substrate 240 is an excitation electrode as a second excitation electrode (hereinafter, referred to as only an "excitation electrode 260") 260, and provided at the interface between the vibrating substrate 220 and the vibrating substrate 240 is a common intermediate excitation electrode 250.

The vibrating substrate 220 is made of a plate in which the cut angle of the quartz crystal substrate is represented as YXltϕ of IRE standards.

The other vibrating substrate 240 is made of a plate in which the cut angle of the quartz crystal substrate is represented as YXltϕ/θ+90°, YXltϕ/θ−90°, YXltϕ+180°/θ+90°, YXltϕ+180°/θ−90°, YXltϕ−180°/θ+90° or YXltϕ−180°/θ−90°.

It is preferable that θ satisfy −5°≦θ≦5°, 85°≦θ≦95°, 175°≦θ≦185° or −95≦θ≦−85°. Such θ enables achievement of a contour shear resonator having good vibration characteristics.

Note that the cut angle of the vibrating substrate 220 and that of the vibrating substrate 240 may be replaced by each other.

The vibrating substrate 220 includes a vibration portion 221, a support arm portion 222 extending from the center of one side a vibration portion 221, and a support portion 223 provided in an end of the support arm portion 222.

An excitation electrode 230 is provided on the front main surface of the vibration portion 221, and is connected through a connection electrode 231 to a connection electrode 232 provided on the surface of the support portion 223.

The vibration portion 221 and the excitation electrode 230 are each square, and the length of one side of the vibration portion 221 is represented as Lb and the length of one side of the excitation electrode 230 is represented as Le.

However, if the vibration portion and the excitation electrode are rectangular, it is possible to excite contour shear vibrations.

The vibrating substrate 240 includes a vibration portion 241, support arm portions 242 and 244 extending on both sides from the centers of two sides facing each other of the vibration portion 241, a support portion 243 provided in an end of the support arm portion 242, and a support portion 245 provided in an end of the support arm portion 244.

Provided on the top surface (the interface with the vibration portion 221) of the vibration portion 241 is an intermediate excitation electrode 250, which is connected through a connection electrode 253 on the surface of the support arm portion 242 to a connection electrode 254 on the surface of the support portion 243.

Then the intermediate excitation electrode 250 is connected through a side electrode 264 to a connection electrode 263 on the back surface side.

On the other hand, provided on the side of the support arm portion 244 are a connection electrode 251 and a connection electrode 252 on the surface of the support portion 245.

The connection electrode 251 is formed to be electrically separate from the intermediate excitation electrode 250, and is provided so as to enhance mutual contact of the vibrating substrate 220 and the vibrating substrate 240 when they are laminated and bonded.

In the vibrating substrate 240, the vibration portion 241 and the intermediate excitation electrode 250 are squares having the same dimensions as those of the vibrating substrate 220. The length of one side of the vibration portion 241 can be represented as Lb, and the length of one side of the intermediate excitation electrode 250 can be represented as Le.

Also, provided on the back main surface of the vibrating substrate 240 is an excitation electrode 260, which is connected through a connection electrode 261 on the back surface of the support arm portion 244 to the connection electrode 262 on the back surface of the support portion 245.

The excitation electrode 230 of the vibrating substrate 220 is connected through connection electrodes 231 and 232 and a side electrode 233 to a connection electrode 262 on the back surface side of the vibrating substrate 240.

Note that the length of one side of the excitation electrode 260 can also be represented as Le.

An electrode material of each of the excitation electrode 230, the intermediate excitation electrode 250 and the excitation electrode 260 is selected from electrode materials mainly composed of Al, Au, Ag and Cu.

Subsequently, the vibration mode of the contour shear resonator 200 of the third embodiment is described with reference to the drawings.

FIGS. 12A and 12B show the vibration portion 221 of the vibrating substrate 220.

FIG. 12A is a side view and FIG. 12B is an explanatory view schematically showing the vibration mode.

The vibrating substrate 220 is a rectangular plate in which the cut angle of the quartz crystal substrate is represented as YXlϕ of IRE standards.

When a positive potential is applied to the excitation electrode 230 (corresponding to the upper electrode) and a negative potential is applied to the intermediate excitation electrode 250 (corresponding to the lower electrode), the vibrating substrate 220 vibrates in contour shear vibration mode as shown by a two dot chain line R in FIG. 12B.

The cut angle and the vibration mode of the vibrating substrate 240 at this point is described with reference to FIGS. 13A to 14B.

Figures 13A, 13B:
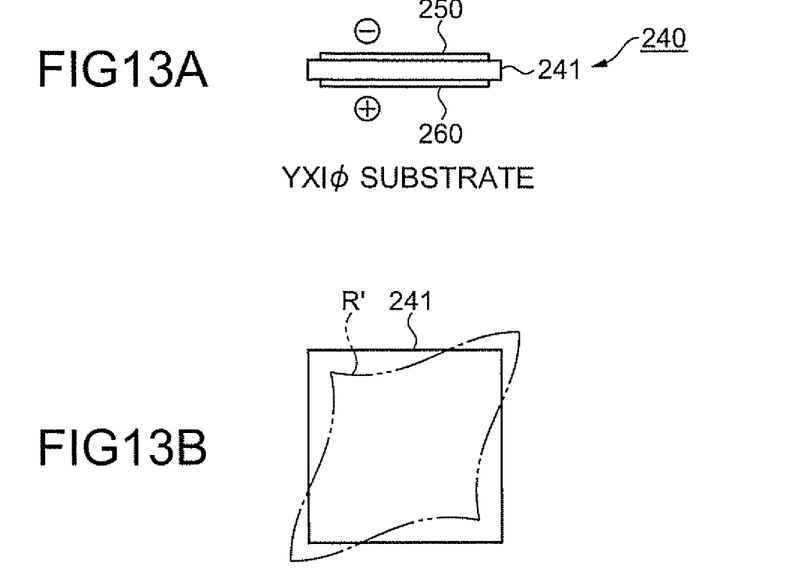
FIG. 13A is a side view.
FIG. 13B is an explanatory view schematically showing the vibrating state.

FIGS. 13A and 13B show a case where the vibrating substrate 240 uses a quartz crystal substrate whose cut angle is represented as YXltϕ of IRE standards, which is the same as that of the vibrating substrate 220.

FIG. 13A is a side view and FIG. 13B is an explanatory view schematically showing the vibration mode.

Here, the intermediate excitation electrode 250 is an electrode common with the vibrating substrate 220, and therefore has a negative potential, whereas the excitation electrode 260 has the same potential as that of the excitation electrode 230, and therefore has a positive potential.

Accordingly, if the vibrating substrate 220 and the vibrating substrate 240 have the completely same cut angle and an opposite phase excitation signal is applied, the vibrating substrate 240 has a vibration mode with a phase shift of 90° with respect to the vibration mode of the vibrating substrate 220 as shown in FIG. 13B.

Concurrently driving the vibrating substrate 240 and the vibrating substrate 220 inhibit their vibrations each other.

Figure 14A:
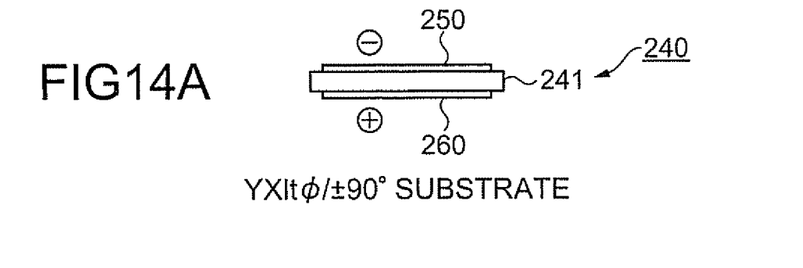
FIG. 14A is a side view.
Figure 14B:
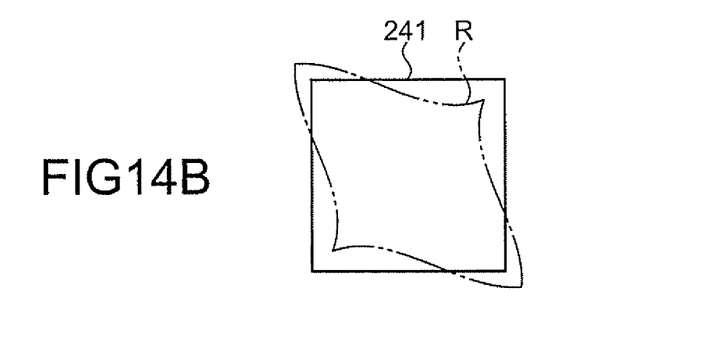
FIG. 14B is an explanatory view schematically showing the vibrating state.

To address this problem, the cut angle of a quartz crystal substrate in the vibrating substrate 240 is set to YXltϕ/θ±90° of IRE standards as shown in FIGS. 14A and 14B to cause the vibration mode of the vibrating substrate 240 to agree with that of the vibrating substrate 220.

FIGS. 14A and 14B represent a case where the cut angle of a quartz crystal substrate is YXltϕ/θ±90° of IRE standards.

FIG. 14A is a side view, and FIG. 14B is an explanatory view schematically showing the vibration mode.

In this way, a potential opposite to that of the vibrating substrate 220, that is, an excitation signal of opposite phase to that of the vibration substrate 220 is applied to the vibrating substrate 240, the vibrating substrate 240 has the same vibration mode (refer to FIG. 12B) as that of the vibrating substrate 220 as shown in FIG. 14B.

Mutual vibrations are not inhibited.

The vibrating substrate 240 with a cut angle represented as YXltϕ±180°/±90° may be combined with the vibrating substrate 220 with a cut angle represented as YXlϕ.

The cut angle of YXltϕ±180°/±90° is equivalent to reversing the two sides of the crystal with respect to YXlϕ.

Therefore, if an excitation signal having a phase opposite to that of the vibrating substrate 220 is applied to the vibrating substrate 240, the vibration mode of the vibrating substrate 240 agrees with that of the vibrating substrate 220, which is not shown in the figure.

For example, in the case of the vibrating substrate 220 having a DT cut of ϕ=−52.5°, if the cut angle of the vibrating substrate 240 is set to ϕ=−52.5° and θ=+90° (corresponding to YXltϕ/θ−90°) or θ=127.5° and θ=±90° (corresponding to YXltϕ+180°/±90°), the vibration modes of the vibrating substrate 20 and the vibrating substrate 40 agree with each other.

Note that in the contour shear resonator 200, like in the aforementioned contour resonator 10 having Lame-mode vibrations, it is more preferable that the dimensions of one sides (Lb and Le) be set such that the resonance frequency Fb of each single body of the vibrating substrate 220 and the vibrating substrate 240 and the resonance frequency Fe of the excitation electrode 230 or the excitation electrode 260 or the intermediate excitation electrode 250 satisfy Fb≅Fe.

Here, Fb≅Fe is specifically 0.995×Fe≦Fb≦1.005×Fe.

Therefore, in the third embodiment described above, a contour resonator is made of a two-layer structure of the vibrating substrate 220 and the vibrating substrate 240 although the structure of related art is made of a single body of the vibrating substrate.

While the electric field efficiency is increased by reducing the distance between electrodes in each single body of the vibrating substrate 220 and the vibrating substrate 240, a contour resonator having structural strength sufficient for practical use can be achieved by employing the laminated structure.

The vibrating substrate 220 and the vibrating substrate 240 are made of quartz crystal substrates, the vibrating substrate 220 is a rectangular plate whose cut angle is represented as YXlϕ of IRE standards, and the vibrating substrate 240 is represented as YXltϕ/±90° or YXltϕ±180°/±90°.

In such a structure of the excitation electrode 230, the intermediate excitation electrode 250 and the excitation electrode 260 as described above, the vibrating substrate 220 and the vibrating substrate 240 vibrate in completely the same contour shear mode.

Therefore, a contour shear resonator having high electric field efficiency and high structural strength can be achieved.

In the aforementioned second embodiment and the third embodiment, quartz crystal, which is stable piezoelectric single crystal, is used as crystals constituting vibrating substrates.

Thus, a contour resonator having good temperature characteristics and small variation with time can be achieved.

However, if piezoelectric single crystal or silicon single crystal such as $LiTaO_3$, $LiNbO_3$, $Li_2B_4O_7$ or $La_3Ga_5SiO_{14}$ is used, the invention may also be applied.

It is to be understood that the invention is not limited to the foregoing embodiments but changes and modifications in the scope of attaining the object of the invention are included in the invention.

For example, in the foregoing first to third embodiments, a contour resonator in which the vibrating substrate is composed of two quartz crystal substrates has been taken as an example and described.

However, the vibrating substrate may be a combination of a quartz crystal substrate and another piezoelectric substrate, or a combination of other two piezoelectric substrates.

With such a structure, by causing the substrates to agree with each other in vibration mode and resonance frequency, causing the vibrating substrate and the excitation electrode to substantially agree with each other in resonance frequency in respective single bodies, and the like, a contour resonator having high electric field efficiency and structural strength can be achieved.

If relative differences in cut angle ϕ and in-plane rotation angle θ among laminated vibrating substrates are shifted by ±5° relative to desired differences, the effects of the invention can also be achieved.

The entire disclosure of Japanese Patent Application Nos: 2007-102416, filed Apr. 10, 2007 and 2008-020330, filed Jan. 31, 2008 are expressly incorporated by reference herein.

What is claimed is:

1. A contour resonator at least including a first vibrating substrate and a second vibrating substrate, the first vibrating substrate and the second vibrating substrate having main surfaces facing each other, the main surfaces being bonded, the contour resonator comprising:
    a first excitation electrode provided on a front main surface of the first vibrating substrate;
    a second excitation electrode provided on a back main surface of the second vibrating substrate; and
    a common intermediate excitation electrode provided at an interface between the first vibrating substrate and the second vibrating substrate, wherein:
    the first excitation electrode and the second excitation electrode are electrically connected to constitute a first terminal;
    the intermediate excitation electrode constitutes a second terminal; and
    the first vibrating substrate and the second vibrating substrate perform a contour vibration in accordance with an excitation signal applied between the first terminal and the second terminal, wherein
    a resonance frequency Fb of a single body of at least one vibrating substrate of the first vibrating substrate or the second vibrating substrate and a resonance frequency Fe of a single body of at least one excitation electrode of the first excitation electrode, the second excitation electrode or the intermediate excitation electrode satisfy a relationship of 0.995×Fe≦Fb≦1.005×Fe;
    the contour resonator is a Lame-mode resonator or a pseudo-Lame mode resonator:
    the first vibrating substrate and the second vibrating substrate are each made of a crystal having crystal anisotropy; and
    the first vibrating substrate and the second vibrating substrate are identical to each other in cut angle of the crystal and different from each other in in-plane rotation angle by 90°, or the first vibrating substrate and the second vibrating substrate are different from each other in a cut angle from the crystal by 180° and identical to each other or different from each other in in-plane rotation angle by 180°.

2. The contour resonator according to claim 1, wherein:
    the first vibrating substrate and the second vibrating substrate are each made of a rectangular quartz crystal substrate;
    a cut angle of one quartz crystal substrate of the first vibrating substrate and the second vibrating substrate is represented as YXltϕ/θ of IRE standards; and
    a cut angle of an other quartz crystal substrate is represented as YXltϕ/θ+90°, YXltϕ/θ−90°, YXltϕ+180°/θ, YXltϕ+180°/θ+180°, YXlt100 +180°/θ−180°, YXltϕ−180°/θ, YXltϕ−180°/θ+180° or YXltϕ−180°/θ−180°.

3. The contour resonator according to claim 2, wherein 40°≦θ≦50°, −50°≦θ≦−40°, 130°≦θ≦140° or −140°≦θ≦−130° is satisfied.

4. The contour resonator according to claim 1, wherein: the contour resonator is a Lame-mode resonator, wherein:
    the first excitation electrode is divided by n (n is an integer of 2 or more) in a planar direction;
    the intermediate excitation electrode and the second excitation electrode are divided by n to face the first excitation electrode; and
    one of n-divided excitation electrodes adjacent to each other is connected to the first terminal and an other is connected to the second terminal.

5. The contour resonator according to claim 1, wherein the contour resonator is a contour shear resonator, wherein:

the first vibrating substrate and the second vibrating substrate are each made of a crystal having crystal anisotropy; and the first vibrating substrate and the second vibrating substrate are identical to each other in cut angle of the crystal and different from each other in-plane rotation angle by 90°, or the first vibrating substrate and the second vibrating substrate are different from each other in cut angle from the crystal by 180° and identical to each other or different from each other in in-plane rotation angle by 90°.

* * * * *